(12) United States Patent
Tsuchi

(10) Patent No.: US 11,232,762 B2
(45) Date of Patent: Jan. 25, 2022

(54) SEMICONDUCTOR DEVICE AND DATA DRIVER

(71) Applicant: LAPIS Semiconductor Co., Ltd., Yokohama (JP)

(72) Inventor: Hiroshi Tsuchi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/831,780

(22) Filed: Mar. 26, 2020

(65) Prior Publication Data

US 2020/0312264 A1  Oct. 1, 2020

(30) Foreign Application Priority Data

Mar. 28, 2019 (JP) ............................. JP2019-062959

(51) Int. Cl.
*G09G 3/36* (2006.01)
*H03F 3/45* (2006.01)
*H03K 3/356* (2006.01)

(52) U.S. Cl.
CPC ......... *G09G 3/3688* (2013.01); *G09G 3/3648* (2013.01); *H03F 3/45* (2013.01); *H03K 3/35613* (2013.01); *G09G 2310/0289* (2013.01); *G09G 2310/0291* (2013.01)

(58) Field of Classification Search
CPC ............... G09G 3/3688; G09G 3/3648; G09G 2310/0289; G09G 2310/0291; G09G 2330/028; G09G 3/3696; H03F 3/45; H03F 3/30; H03F 3/45475; H03K 3/35613; H03K 19/017
See application file for complete search history.

(56) References Cited

U.S. PATENT DOCUMENTS

2009/0244056 A1*  10/2009  Tsuchi ................. G09G 3/3688
                                                              345/214

FOREIGN PATENT DOCUMENTS

JP          2009198801 A     9/2009

* cited by examiner

*Primary Examiner* — Christopher J Kohlman
(74) *Attorney, Agent, or Firm* — Rabin & Berdo, P.C.

(57) ABSTRACT

In the present invention, a differential amplifier that includes a first output transistor and a second output transistor includes a boost circuit that includes a third output transistor and a fourth output transistor. The first output transistor delivers a current according to a first differential signal generated in a differential stage to an output terminal. The second output transistor extracts a current according to a second differential signal generated as a signal which is the same phase with a different potential of the first differential signal from the output terminal. The third output transistor delivers a current to the output terminal according to a level-shifting signal generated by level-shifting the first differential signal. The fourth output transistor extracts a current from the output terminal according to a level-shifting signal generated by level-shifting the second differential signal. As the third and fourth output transistors, transistors having withstand voltages against gate-source voltages lower than those of the first and second output transistors and drain currents larger than those of the first and second output transistors are employed.

15 Claims, 8 Drawing Sheets

SEMICONDUCTOR DEVICE AND DATA DRIVER

BACKGROUND

1. Technical Field

The present invention relates to a semiconductor device in which an amplifier circuit is formed and a data driver of a display device.

2. Related Art

Currently, as an active matrix type display device, for example, a liquid crystal display device or an organic EL display device has become a mainstream. The display device includes a display panel, a data driver, and a scanning driver. On the display panel, a plurality of data lines and a plurality of scanning lines are wired in an intersecting manner, and display cells connected to the plurality of data lines via pixel switches are arranged in a matrix. The data driver supplies analog voltage signals corresponding to gradation levels to the plurality of data lines of the display panel. The scanning driver supplies scanning signals that control ON/OFF of respective pixel switches to the plurality of scanning lines of the display panel.

Recently, with increased screen size and higher resolution of the display panel, load capacitance of data lines of the display panel increases, and a driving period per one pixel for driving the data line by the data driver tends to be shortened. The data driver charges or discharges the load capacitance of the data line according to an input signal corresponding to a luminance level indicated by a video signal to supply an output signal corresponding to the input signal to the data line.

Accordingly, when the load capacitance of the data line increases and the driving period shortens, an amplification operation cannot follow a level transition of the input video signal. In association with this, a rising or a falling of a voltage level of the output signal delays, possibly causing image degradation, such as display unevenness.

Therefore, to reduce such a failure, there has been proposed a data driver to which a circuit (hereinafter referred to as a boost circuit) is added. The boost circuit shortens rise and fall times of an output signal output from an output stage of the data driver, so-called output response time, (for example, see JP-A-2009-198801).

The boost circuit includes metal oxide semiconductor (MOS) type first to third transistors. The first transistors (MP9, MN9) generate constant currents and supplies them to source terminals of second transistors (MP8, MN8). Gate terminals of the second transistors are connected to gate terminals of output transistors included in an operational amplifier (24) as an amplifier circuit. Gate terminals of the third transistors (MPO2, MNO2) are connected to the source terminals of the second transistors. Power supply potentials are applied to source terminals of the third transistors, and drain terminals of the third transistors are connected to an output terminal of the operational amplifier.

With the configuration, for example, when a voltage level of an input signal to the operational amplifier increases and a voltage level of an output signal output from the output terminal of the operational amplifier increases delayed to this, the second and third transistors (MP8, MPO2) enter an ON state during the period. When the third transistor enters the ON state, the transistor delivers a current according to a gate potential to the output terminal of the operational amplifier to charge the output terminal. This accelerates a speed of increase in voltage level of the output signal and therefore the rise time can be shortened.

The above-described electric potentials of the gate terminals of the third transistors (MPO2, MNO2) become electric potentials shifted by electric potentials of gate terminals of output transistors (MPO, MNO) in the operational amplifier (24) by amounts of threshold voltages of the second transistors (MP8, MN8). Therefore, since gate-source voltages |Vgs| of the third transistors (MPO2, MNO2) become lower than |Vgs| of the output transistors (MPO, MNO) in the operational amplifier (24), the third transistors possibly do not enter the ON state.

Therefore, to shorten the output response time in the boost circuit, sizes (especially gate widths) of the third transistors (MPO2, MNO2) need to be increased, and this causes a problem of increase in chip area.

Therefore, the present invention provides a semiconductor device and a data driver that ensure reducing an increase in area occupied by a chip and shortening an output response time of an amplifier circuit.

SUMMARY

A semiconductor device according to the present invention includes an input terminal, an output terminal, first and second power supply terminals, a differential stage, a first conductivity type first output transistor, a second conductivity type second output transistor, a first potential control circuit, a second potential control circuit, a first conductivity type third output transistor, and a second conductivity type fourth output transistor. The input terminal is configured to receive an input signal. The output terminal is configured to output an output signal. The first and second power supply terminals are configured to receive a first power supply potential and a second power supply potential which is lower than the first power supply potential, respectively. The differential stage is configured to generate a first differential signal and a second differential signal. The first differential signal corresponds to a difference between the input signal and the output signal. The second differential signal is generated as a signal which is the same phase with a different potential of the first differential signal. The first output transistor is connected to the first power supply terminal. The first output transistor is configured to receive the first differential signal by own control terminal. The first output transistor is configured to supply a current corresponding to the first differential signal based on the first power supply potential to the output terminal. The second output transistor is connected to the second power supply terminal. The second output transistor is configured to receive the second differential signal by own control terminal. The second output transistor is configured to flow a current corresponding to the second differential signal from the output terminal to the second power supply terminal. The first potential control circuit is configured to level-shift the first differential signal to a first power supply potential side to generate a first shift signal. The second potential control circuit is configured to level-shift the second differential signal to a second power supply potential side to generate a second shift signal. The third output transistor is connected to the first power supply terminal. The third output transistor is configured to receive the first shift signal by own control terminal. The third output transistor is configured to supply a current corresponding to the first shift signal based on the first power supply potential to the output terminal. The fourth output transistor is connected to the second power supply terminal. The fourth output transistor is configured to receive the second shift signal by own control terminal. The fourth output transistor is configured to flow a current corresponding to the second shift signal from the output terminal to the second power supply terminal. The third output transistor is a transistor having a withstand voltage against a voltage between the first power supply terminal and the control terminal lower than a withstand voltage of the first output transistor and a drain current corresponding to the voltage between the first power supply terminal and the control terminal larger than a drain current of the first output transistor. The fourth output transistor is a transistor having a withstand voltage against a voltage between the second power supply terminal and the control terminal lower than a withstand voltage of the second output transistor and a drain current corresponding to the voltage between the second power supply terminal and the control terminal larger than a drain current of the second output transistor.

A semiconductor device according to the present invention includes an input terminal, an output terminal, first and second power supply terminals, a differential stage, a first conductivity type first output transistor, a second conductivity type second output transistor, a first potential control circuit, and a first conductivity type third output transistor. The input terminal is configured to receive an input signal. The output terminal is configured to output an output signal. The first and second power supply terminals are configured to receive a first power supply potential and a second power supply potential different from the first power supply potential, respectively. The differential stage is configured to generate a first differential signal and a second differential signal. The first differential signal corresponds to a difference between the input signal and the output signal. The second differential signal is generated as a signal which is the same phase with a different potential of the first differential signal. The first output transistor is connected to the first power supply terminal. The first output transistor is configured to receive the first differential signal by own control terminal. The first output transistor is configured to output a current corresponding to the first differential signal based on the first power supply potential to the output terminal. The second output transistor is connected to the second power supply terminal. The second output transistor is configured to receive the second differential signal by own control terminal. The second output transistor is configured to output a current corresponding to the second differential signal based on the second power supply potential to the output terminal. The first potential control circuit is configured to level-shift the first differential signal to a first power supply potential side to generate a first shift signal. The third output transistor is connected to the first power supply terminal. The third output transistor is configured to receive the first shift signal by own control terminal. The third output transistor is configured to output a current corresponding to the first shift signal based on the first power supply potential to the output terminal. The third output transistor is a transistor having a withstand voltage against a voltage between the first power supply terminal and the control terminal lower than a withstand voltage of the first output transistor and a drain current corresponding to the voltage between the first power supply terminal and the control terminal larger than a drain current of the first output transistor.

A data driver according to the present invention includes a plurality of amplifier circuits. The plurality of amplifier circuits are configured to individually amplify a plurality of gradation voltages having respective voltage values corresponding to luminance levels of a plurality of respective pixels. The plurality of amplifier circuits are configured to supply the amplified gradation voltages to a display device. The amplifier circuits each include an input terminal, an output terminal, first and second power supply terminals, a differential stage, a first conductivity type first output transistor, a second conductivity type second output transistor, a first potential control circuit, and a first conductivity type third output transistor. The input terminal is configured to receive the gradation voltage as an input signal. The output terminal is configured to supply an output signal obtained by amplifying the gradation voltage to the display device. The first and second power supply terminals are configured to receive a first power supply potential and a second power supply potential different from the first power supply potential, respectively. The differential stage is configured to generate a first differential signal and a second differential signal. The first differential signal corresponds to a difference between the input signal and the output signal. The second differential signal is generated as a signal which is the same phase with a different potential of the first differential signal. The first output transistor is connected to the first power supply terminal. The first output transistor is configured to receive the first differential signal by own control terminal. The first output transistor is configured to output a current corresponding to the first differential signal based on the first power supply potential to the output terminal. The second output transistor is connected to the second power supply terminal. The second output transistor is configured to receive the second differential signal by own control terminal. The second output transistor is configured to output a current corresponding to the second differential signal based on the second power supply potential to the output terminal. The first potential control circuit is configured to level-shift the first differential signal to a first power supply potential side to generate a first shift signal. The third output transistor is connected to the first power supply terminal. The third output transistor is configured to receive the first shift signal by own control terminal. The third output transistor is configured to output a current corresponding to the first shift signal based on the first power supply potential to the output terminal. The third output transistor is a transistor having a withstand voltage against a voltage between the first power supply terminal and the control terminal lower than a withstand voltage of the first output transistor and a drain current corresponding to the voltage between the first power supply terminal and the control terminal larger than a drain current of the first output transistor.

In the present invention, the differential amplifier that includes the first output transistor, which delivers the current according to the first differential signal generated in the differential stage, to the output terminal, and the second output transistor, which extracts the current according to the second differential signal generated as a signal which is the same phase with a different potential of the first differential signal, from the output terminal, includes the following boost circuit. That is, the boost circuit includes at least one of the third output transistor, which delivers the current to the output terminal by receiving the level-shifting signal generated by level-shifting the first differential signal by a gate end, and the fourth output transistor, which extracts the current from the output terminal by receiving the level-shifting signal generated by level-shifting the second differential signal by a gate end. In this respect, as the third and fourth output transistors, transistors having the drain currents relative to the gate-source voltages larger than those of the first and second output transistors and the withstand voltages against the gate-source voltages lower than those of the first and second output transistors are employed.

With the configuration, the charging and discharge speeds to the load connected to the output terminal can be promoted without increase in element size of the third or the fourth output transistor of the boost circuit. Therefore, the present invention allows shortening the output response time of the amplifier circuit without increase in area occupied by the chip or cost increase.

DETAILED DESCRIPTION

Figure 1:
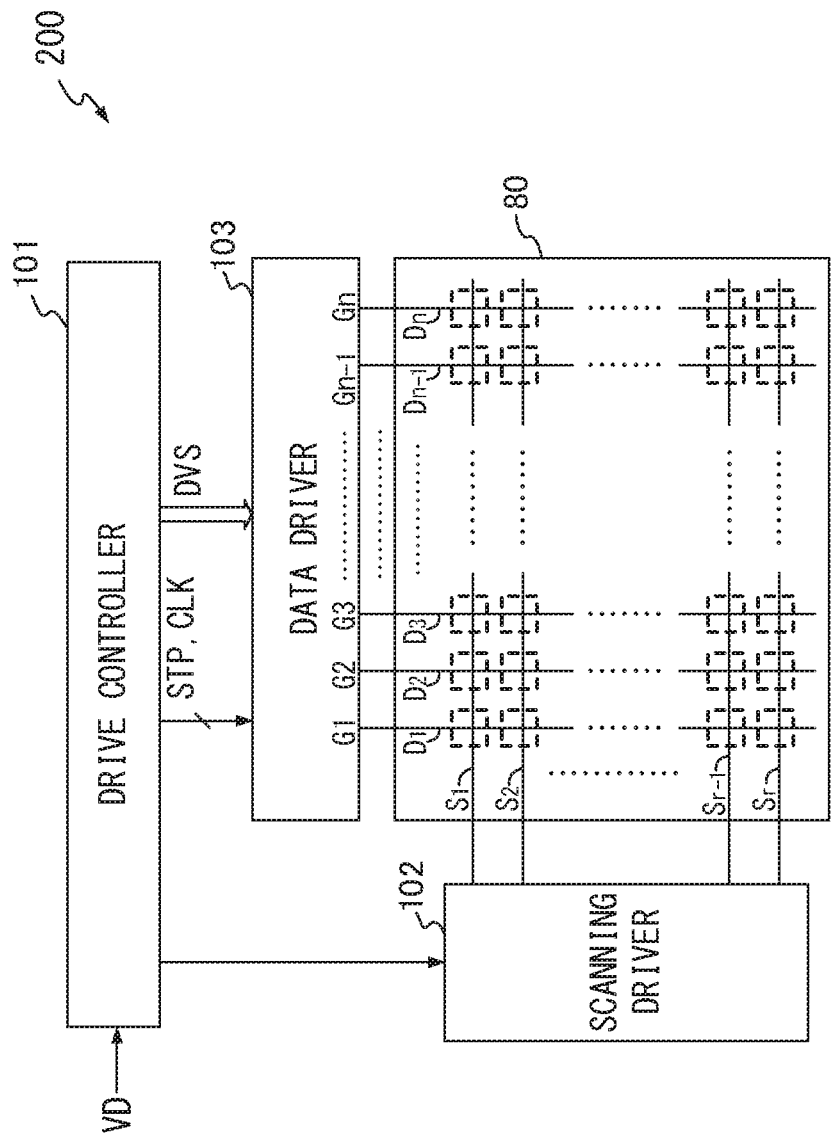
FIG. 1 is a block diagram illustrating a schematic configuration of a display device 200 including a data driver as a semiconductor device according to the present invention.

FIG. 1 is a block diagram illustrating a schematic configuration of a display device 200 that includes a data driver as a semiconductor device according to the present invention.

As illustrated in FIG. 1, the display device 200 includes a display panel 80, a drive controller 101, a scanning driver 102, and a data driver 103.

The display panel 80 includes, for example, a liquid crystal panel or an organic EL panel, and includes r (r is a natural number of 2 or more) horizontal scanning lines S1 to Sr extending in a horizontal direction of a two-dimensional screen, and n (n is a natural number of 2 or more) data lines D1 to Dn extending in a vertical direction of the two-dimensional screen. Display cells serving as pixels are formed on respective intersecting portions of the horizontal scanning lines and the data lines.

The drive controller 101 supplies the scanning driver 102 with a scan timing signal to generate a horizontal scanning pulse supplied to each of the horizontal scanning lines.

Further, the drive controller 101 generates control signals, such as a start pulse signal STP and a clock signal CLK, and a video digital signal DVS including a series of video data fragments that express a luminance level of each pixel by, for example, eight bits based on a video signal VD to supply them to the data driver 103.

The scanning driver 102 sequentially applies the horizontal scanning pulse to each of the horizontal scanning lines S1 to Sr of the display panel 80 based on the scan timing signal supplied from the drive controller 101.

The data driver 103 acquires the series of video data fragments (hereinafter referred to as video data PD), which are included in the video digital signal DVS, according to the control signals (STP, CLK) supplied from the drive controller 101. The data driver 103 converts the acquired series of video data PD into n driving voltage signals G1 to Gn having voltage values with magnitudes corresponding to the respective luminance levels for every (n) horizontal scanning line, and supplies them to the respective data lines D1 to Dn of the display panel 80.

Figure 2:
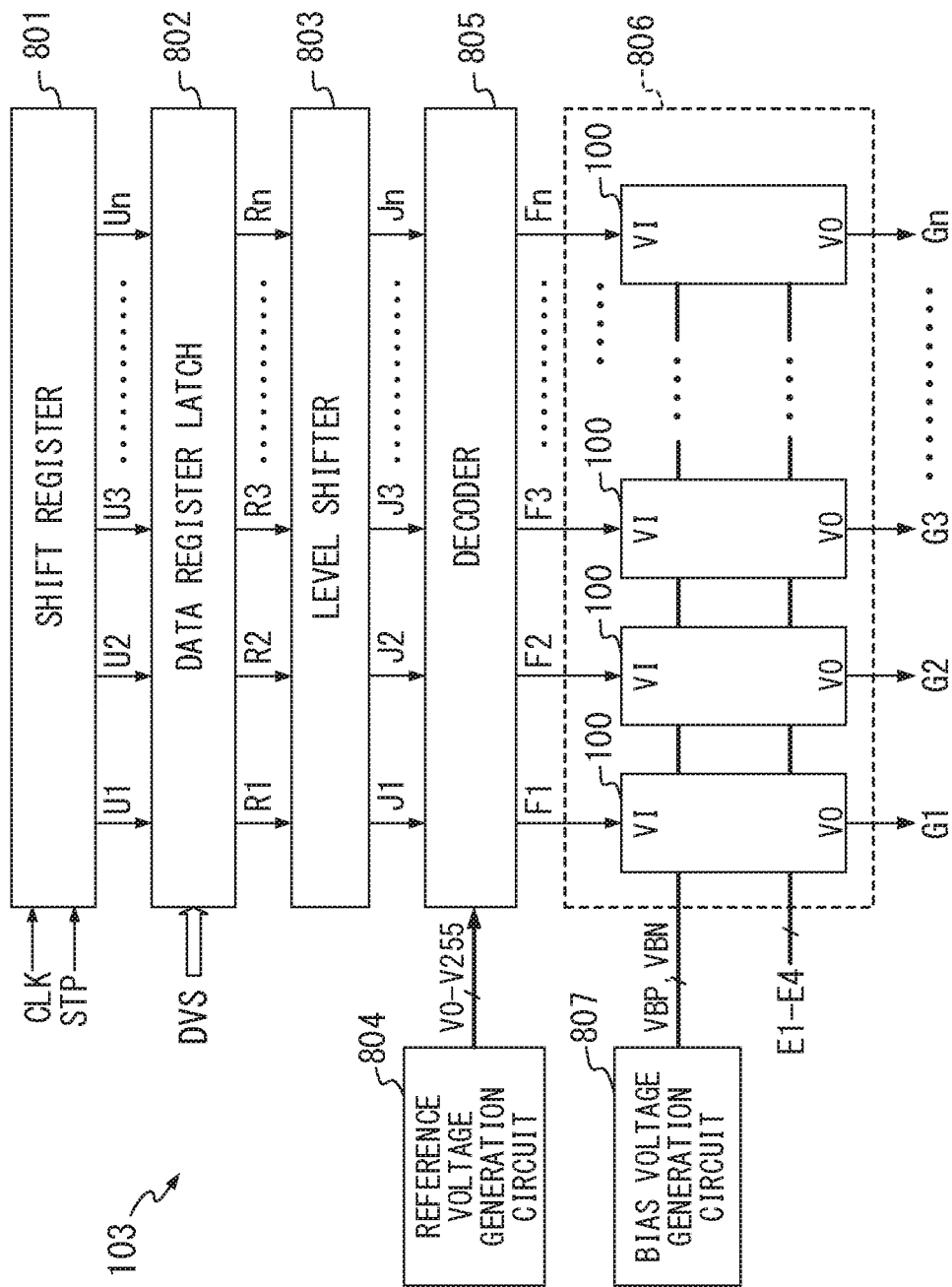
FIG. 2 is a block diagram illustrating an internal configuration of a data driver 103.

FIG. 2 is a block diagram illustrating an internal configuration of the data driver 103.

The data driver 103 is formed in a semiconductor IC chip and, as illustrated in FIG. 2, includes a shift register 801, a data register latch 802, a level shifter 803, a reference voltage generation circuit 804, a decoder 805, an output unit 806, and a bias voltage generation circuit 807.

The shift register 801 generates latch timing signals U1 to Un for selecting a latch in synchronization with the clock signal CLK according to the start pulse STP supplied from the drive controller 101, and supplies them to the data register latch 802.

The data register latch 802 sequentially acquires the video data PD supplied from the drive controller 101 based on the latch timing signals U1 to Un, and supplies video data signals R1 to Rn indicating the respective pieces of the video data PD to the level shifter 803 for every (n) horizontal scanning line.

The level shifter 803 performs level shift processing to increase the signal level to each of the video data signals R1 to Rn, and supplies obtained n pieces of video data signal J1 to Jn to the decoder 805.

The reference voltage generation circuit 804 generates reference voltages V0 to V255 corresponding to respective gradations of, for example, 256 gradations and supplies the reference voltages V0 to V255 to the decoder 805.

The decoder 805 selects a reference voltage for each of the video data signals J1 to Jn corresponding to the video data signal among the reference voltages V0 to V255. Then, the decoder 805 supplies gradation voltage signals F1 to Fn having the reference voltage selected for each of the video data signals J1 to Jn to the output unit 806.

The bias voltage generation circuit 807 generates a plurality of bias signals to set an operating current that causes the output unit 806 to operate and supplies them to the output unit 806. The bias voltage generation circuit 807 also generates first and second bias signals VBP and VBN.

The output unit 806 outputs each of the individually amplified gradation voltage signals F1 to Fn as the driving voltage signals G1 to Gn. The driving voltage signals G1 to Gn output from the output unit 806 are supplied to the data lines D1 to Dn of the display panel 80.

As illustrated in FIG. 2, the output unit 806 includes n amplifier circuits 100 having the same internal configuration disposed corresponding to the respective gradation voltage signals F1 to Fn in one-to-one.

The respective amplifier circuits 100 operate by receiving power supply potentials E1 to E4 and generate output signals VO based on the input signals VI received by themselves. The output signal VO has a voltage value corresponding to the input signal VI with an amplified amount of current, and the amplifier circuit 100 outputs it from an output terminal N2.

For example, the amplifier circuit 100 that has received the gradation voltage signal F1 as the input signal VI generates the output signal VO having a voltage value corresponding to the gradation voltage signal F1 with an amplified amount of current as the driving voltage signal G1 and outputs it. The amplifier circuit 100 that has received the gradation voltage signal F2 as the input signal VI generates the output signal VO having the voltage value corresponding to the gradation voltage signal F2 with an amplified amount of current as the driving voltage signal G2 and outputs it.

Embodiment 1

Figure 3:
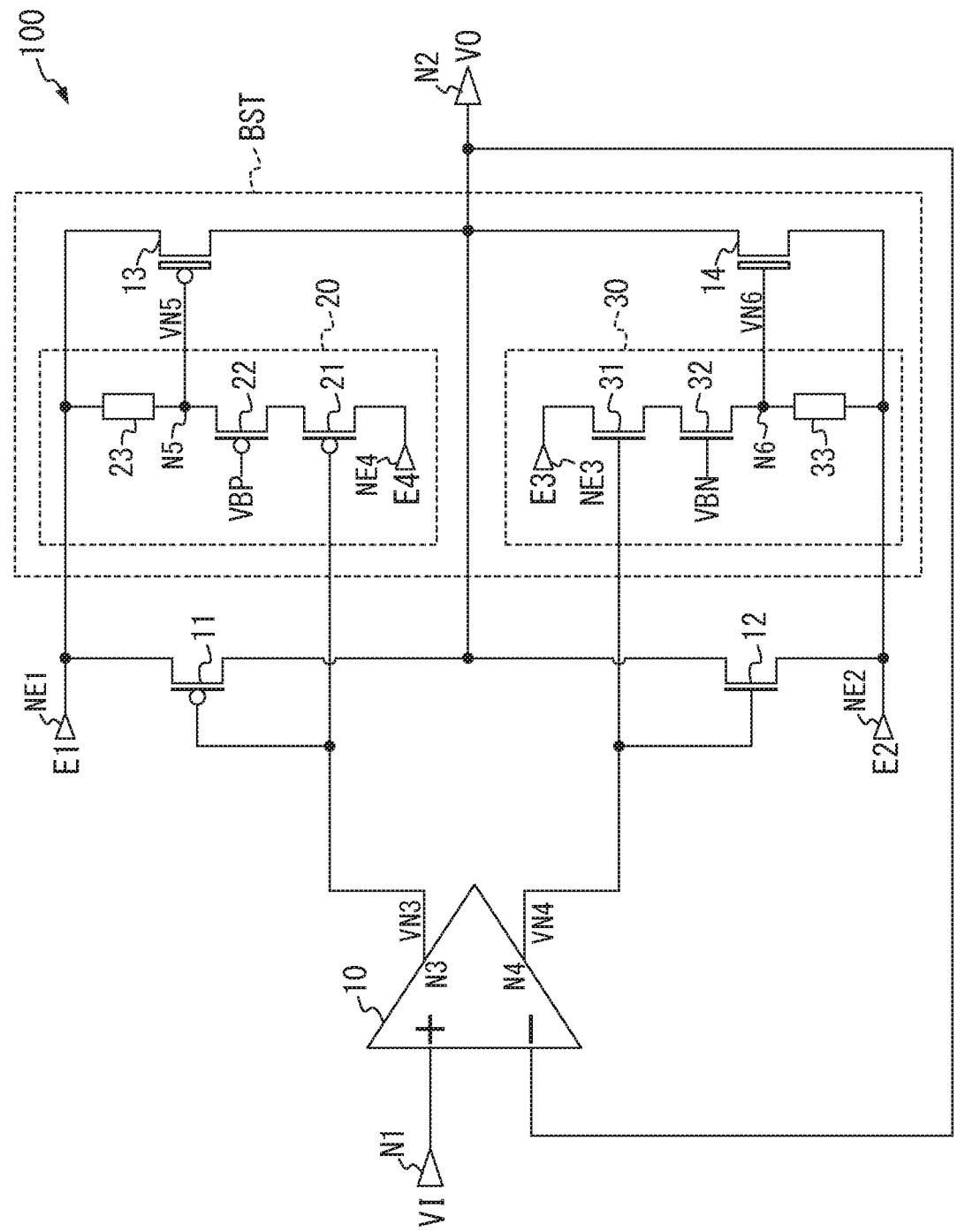
FIG. 3 is a circuit diagram illustrating a first embodiment of an amplifier circuit 100.

FIG. 3 is a circuit diagram illustrating the internal configuration of the amplifier circuit 100 as the first embodiment.

The amplifier circuit 100 includes an input terminal N1 that receives the input signal VI, the output terminal N2 that outputs the output signal VO as an amplification result, and first to fourth power supply terminals NE1 to NE4 that receive the first to fourth power supply potentials E1 to E4, respectively.

Note that the power supply potentials E1 to E4 have, for example, a magnitude relationship as follows.

$$E3 \geq E1 \geq E2 \geq E4$$

Further, the amplifier circuit 100 includes a differential amplifier including a differential stage 10, a first conductivity type (P channel type) first output transistor 11, and a second conductivity type (N channel type) second output transistor 12, and a boost circuit BST.

The differential stage 10 receives the input signal VI received by the input terminal N1 by own non-inverting input end (+) and receives the output signal VO from the output terminal N2 by own inverting input end (−). The differential stage 10 outputs a first differential signal VN3 corresponding to a difference between the input signal VI and the output signal VO via own first output end N3 and outputs a second differential signal VN4 generated as a signal which is the same phase with a different potential of the first differential signal VN3 from a second output end N4.

The first output transistor 11 has own first terminal (source) connected to the first power supply terminal NE1 and second terminal (drain) connected to the output terminal N2. The output transistor 11 receives the first differential signal VN3 output from the first output end N3 of the differential stage 10 by own control terminal (gate). The output transistor 11 supplies a current corresponding to the first differential signal VN3 based on the first power supply potential E1 to the output terminal N2.

The second output transistor 12 has own first terminal (source) connected to the second power supply terminal NE2 and second terminal (drain) connected to the output terminal N2. The output transistor 12 receives the second differential signal VN4 output from the second output end N4 of the differential stage 10 by own control terminal (gate). The output transistor 12 flows a current corresponding to the second differential signal VN4 from the output terminal N2 to the second power supply terminal NE2.

When a level of the input signal VI substantially changes more than a predetermined value, the boost circuit BST delivers the current to the output terminal N2 to shorten output response times of the output signals VO output by the output transistors 11 and 12 according to the input signal VI.

The boost circuit BST includes a first potential control circuit 20, a second potential control circuit 30, a first conductivity type (P channel type) third output transistor 13, and a second conductivity type (N channel type) fourth output transistor 14.

The first potential control circuit 20 includes first conductivity type (P channel type) first and second transistors 21 and 22 and a first load element 23 as a first load having own first terminal connected to the power supply terminal NE1. For example, a resistive element and a current source may be employed as the first load element 23.

The transistor 21 has own second terminal (drain) connected to the power supply terminal NE4 and first terminal (source) connected to a second terminal (drain) of the transistor 22. The transistor 21 receives the first differential signal VN3 output from the first output end N3 of the differential stage 10 by own control terminal (gate). The transistor 22 has own first terminal (source) connected to a second terminal of the first load element 23 and a control terminal (gate) of the output transistor 13 via a node N5. The transistor 22 receives a bias signal VBP supplied from the bias voltage generation circuit 807 by own control terminal (gate). Thus, the first and second transistors 21 and 22 are cascade-connected between the second terminal (N5) of the first load element 23 and the power supply terminal NE4. Note that positions of the first and second transistors 21 and 22, which are cascade-connected between the second terminal (N5) of the first load element 23 and the power supply terminal NE4, may be exchanged.

With the configuration, the first potential control circuit 20 receives the first differential signal VN3 output from the differential stage 10, generates a first shift signal VN5 generated by level-shifting it to the first power supply potential E1 side, and supplies it to the control terminal (gate) of the output transistor 13.

The second potential control circuit 30 includes second conductivity type (N channel type) third and fourth transistors 31 and 32 and a second load element 33 as a second load having own first terminal connected to the second power supply terminal NE2. For example, a resistive element maybe employed as the second load element 33.

The transistor 31 has own second terminal (drain) connected to the power supply terminal NE3 and first terminal (source) connected to a second terminal (drain) of the transistor 32. The transistor 31 receives the second differential signal VN4 output from the second output end N4 of the differential stage 10 by own control terminal (gate). The transistor 32 has own first terminal (source) connected to a second terminal of the second load element 33 and a control terminal (gate) of the output transistor 14 via a node N6. The transistor 32 receives the bias signal VBN supplied from the bias voltage generation circuit 807 by own control terminal (gate). Thus, the third and fourth transistors 31 and 32 are cascade-connected between a second terminal (N6) of the second load element 33 and the power supply terminal NE3. Note that positions of the third and fourth transistors 31 and 32, which are cascade-connected between the second terminal (N6) of the second load element 33 and the power supply terminal NE3, may be exchanged.

With the configuration, the second potential control circuit 30 receives the second differential signal VN4 output from the differential stage 10, generates a second shift signal VN6 generated by level-shifting it to the second power supply potential E2 side, and supplies it to the control terminal (gate) of the output transistor 14.

The second transistor 22 functions as a clamp element controlled by the first bias signal VBP so as not to exceed a withstand voltage between a first terminal (source) and a control terminal (gate) of the third output transistor 13 described later. Hereinafter, such a withstand voltage, that is, an absolute value of the maximum voltage applicable between the gate and the source of the transistor is referred to as a Vgs maximum applied voltage.

The first bias signal VBP has an electric potential level-shifted to the fourth power supply potential E4 side by an amount of voltage not exceeding a total voltage of the Vgs maximum applied voltage of the output transistor 13 and a threshold voltage (absolute value) of the transistor 22 from the first power supply potential E1.

Thus, the first shift signal VN5 is restricted within a voltage range from the first power supply potential E1 to the Vgs maximum applied voltage of the output transistor 13.

Similarly, the fourth transistor 32 functions as a clamp element controlled by the second bias signal VBN so as not to exceed a withstand voltage (Vgs maximum applied voltage) between a first terminal (source) and a control terminal (gate) of the fourth output transistor 14 described later.

Accordingly, the second bias signal VBN has an electric potential shifted to the third power supply potential side by an amount of voltage not exceeding a total voltage of the Vgs maximum applied voltage of the output transistor 14 and a threshold voltage of the transistor 32 from the second power supply potential E2.

Thus, the second shift signal VN6 is restricted within a voltage range from the second power supply potential E2 to the Vgs maximum applied voltage of the output transistor 14.

The third output transistor 13 has own first terminal (source) connected to the first power supply terminal NE1 and second terminal (drain) connected to the output terminal N2. The output transistor 13 receives the first shift signal VN5 output from the first potential control circuit 20 by own control terminal (gate). The output transistor 13 supplies a current corresponding to the first shift signal VN5 based on the first power supply potential E1 to the output terminal N2.

The fourth output transistor 14 has own first terminal (source) connected to the second power supply terminal NE2 and second terminal (drain) connected to the output terminal N2. The output transistor 14 receives the second shift signal VN6 output from the second potential control circuit 30 by own control terminal (gate). The output transistor 14 flows a current corresponding to the second shift signal VN6 from the output terminal N2 to the second power supply terminal NE2.

The third and fourth output transistors 13 and 14 have drain current vs. gate-source voltage characteristics different from those of the above-described first and second output transistors 11 and 12.

Figure 4:
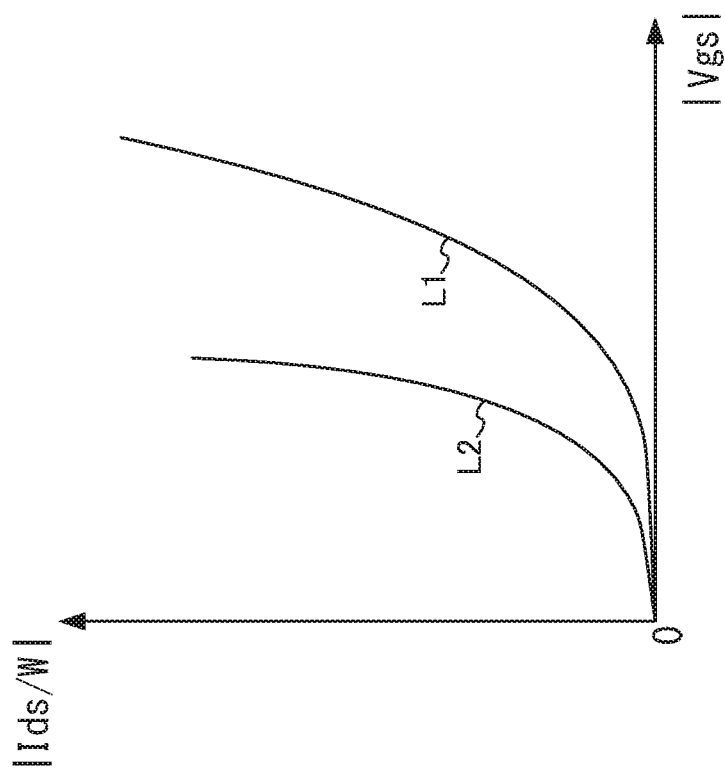
FIG. 4 is a characteristic diagram representing gate-source voltage-drain current characteristics of transistors included in the amplifier circuit 100.

FIG. 4 is a characteristic diagram representing the drain current vs. gate-source voltage characteristics of the transistors included in the amplifier circuit 100.

Among the respective transistors included in the amplifier circuit 100, all transistors excluding the output transistors 13 and 14 (11, 12, 21, 22, 31, 32) have drain current vs. gate-source voltage characteristics indicated by a characteristic curve L1 of FIG. 4. The output transistors 13 and 14 have drain current vs. gate-source voltage characteristics indicated by a characteristic curve L2 of FIG. 4.

As illustrated in FIG. 4, the third output transistor 13 is a transistor, for example, that has an amount of drain current |Ids/W| according to a voltage |Vgs| between the first terminal (source) and the control terminal (gate) larger than that of the first output transistor 11 and a withstand voltage (Vgs maximum applied voltage) between the first terminal (source) and the control terminal (gate) lower than that of the first output transistor 11. As the first conductivity type (P channel type) output transistor 13 having the characteristics, for example, a transistor in which a gate insulating film is formed thinner than that of the first output transistor 11 and a first conductivity type (P channel type), for example, an LDMOS (Laterally Diffused MOS) transistor is used. The withstand voltage between the first terminal (source) and the second terminal (drain) of the first conductivity type (P channel type) output transistor 13 only needs to be equal to or more than that of the first output transistor 11.

Similarly, the fourth output transistor 14 is a transistor, for example, that has an amount of drain current Ids/W according to a voltage Vgs between the first terminal (source) and the control terminal (gate) larger than that of the second output transistor 12 and a withstand voltage (Vgs maximum applied voltage) between the first terminal (source) and the control terminal (gate) lower than that of the second output transistor 12. As the second conductivity type (N channel type) output transistor 14 having the characteristics, for example, a transistor in which a gate insulating film is formed thinner than that of the second output transistor 12 and a second conductivity type (N channel type), for example, an LDMOS (Laterally Diffused MOS) transistor is used. The withstand voltage between the first terminal (source) and the second terminal (drain) of the second conductivity type (N channel type) output transistor 14 only needs to be equal to or more than that of the second output transistor 12.

The following describes the operation of the amplifier circuit 100 illustrated in FIG. 3 in which the above-described first conductivity type (P channel type) transistor is referred to as "PMOS transistor" and the second conductivity type (N channel type) transistor is referred to as "NMOS transistor."

The amplifier circuit 100 illustrated in FIG. 3 has a negative feedback configuration in which the input terminal N1 is connected to the non-inverting input end (+) of the differential stage 10 and the output terminal N2 is connected to the inverting input end (−). In one example illustrated in FIG. 2, the input signal VI received by each amplifier circuit 100 is the gradation voltage signal F output from the decoder 805. Accordingly, at every data period of the video data fragment corresponding to each pixel, a step signal at a voltage level corresponding to the gradation representing the luminance level of the pixel is input to the amplifier circuit 100 as the input signal VI and the output voltage VO corresponding to the input signal VI is output from the output terminal N2. Among the power supply potentials E1 to E4 received by the amplifier circuits 100, for example, the power supply potentials E1 and E3 are high power supply potentials and the power supply potentials E2 and E4 are low power supply potentials.

As an initial state, in a case where the input signal VI has a constant voltage and the output voltage VO is in a stable output state, voltage values of the first differential signal VN3 and the second differential signal VN4 each output from the output ends N3 and N4 of the differential stage 10 are constant. That is, the gate-source voltages |Vgs| of the respective PMOS transistor 11 and NMOS transistor 12 are stable at voltages slightly larger than the respective absolute values of the threshold voltages. While both of the PMOS transistor 11 and the NMOS transistor 12 are in the ON state, an idling current flowing each transistor is controlled to be sufficiently small currents by the first and second differential signals VN3 and VN4.

The PMOS transistor 21 included in the first potential control circuit 20 controls the first shift signal VN5 in the node N5 to be a high electric potential to the extent of the threshold voltage (absolute value) of the PMOS transistor 21 from the first differential signal VN3 of the differential stage 10. When the threshold voltages of the PMOS transistors 11 and 21 are similar extent, the first shift signal VN5 in the node N5 in the stable output state has a voltage sufficiently close to the power supply potential E1. At this time, the PMOS transistor 22 has own gate-source voltage sufficiently larger than the threshold voltage (absolute value) and is in the ON state. Accordingly, the PMOS transistor 13 that receives the first shift signal VN5 by the control terminal (gate) has a gate-source voltage difference smaller than the threshold voltage (absolute value) and therefore enters an OFF state.

The NMOS transistor 31 included in the second potential control circuit 30 controls the second shift signal VN6 in the node N6 to be a low electric potential to the extent of the threshold voltage of the NMOS transistor 31 from the second differential signal VN4 of the differential stage 10. When the threshold voltages of the NMOS transistors 12 and 31 are similar extent, the second shift signal VN6 in the node N6 in the stable output state has a voltage sufficiently close to the power supply potential E2. At this time, the NMOS transistor 32 has a gate-source voltage difference sufficiently larger than the threshold voltage and is in the ON state. Accordingly, the NMOS transistor 14 that receives the second shift signal VN6 by the control terminal (gate) has own gate-source voltage difference smaller than the threshold voltage and enters an OFF state.

Thus, in the case where the input signal VI has the constant voltage and the output voltage VO is in the stable output state, the PMOS transistor 13 and the NMOS transistor 14 as the output transistors both enter the OFF state.

Next, an operation when the input signal VI changes to a voltage on the power supply potential E1 side (high electric potential side) in a data period subsequent to the data period during which the input signal VI and the output signal VO are both in the stable state will be described. The first and second differential signals VN3 and VN4 in the first and second output ends N3 and N4 of the differential stage 10 both change to the power supply potential E2 side (low electric potential side) and the NMOS transistor 12 enters the OFF state. In contrast to this, the PMOS transistor 11 increases own gate-source voltage difference and enters the ON state and delivers the current based on the power supply potential E1 to the output terminal N2. Thus, the PMOS transistor 11 charges the output terminal N2 and the load connected to the output terminal N2, namely, load capacitance of the data line.

When the second differential signal VN4 in the differential stage 10 decreases, the second shift signal VN6 output from the second potential control circuit 30 decreases up to the power supply potential E2. Accordingly, the NMOS transistor 14 continues maintaining the OFF state. When the first differential signal VN3 in the differential stage 10 decreases, the first shift signal VN5 output from the first potential control circuit 20 also decreases from the proximity of the power supply potential E1. When the gate-source voltage difference of the PMOS transistor 13 increases by the first shift signal VN5 and exceeds the threshold voltage of the PMOS transistor 13, the PMOS transistor 13 turns ON. Thus, the PMOS transistor 13 delivers the current based on the power supply potential E1 to the output terminal N2 to charge the load connected to the output terminal N2, namely, a parasitic capacitance of the data line. That is, in cooperation with the above-described charging operation by the PMOS transistor 11, the charging speed is promoted.

As described above, the PMOS transistor 13 has the drain current vs. gate-source voltage characteristics indicated by the characteristic curve L2 of FIG. 4. Accordingly, the PMOS transistor 13 has current drive capability higher than that of the PMOS transistor 11, which has the drain current vs. gate-source voltage characteristics indicated by the characteristic curve L1 of FIG. 4. Therefore, even when the gate-source voltage difference of the PMOS transistor 13 is smaller than the gate-source voltage difference of the PMOS transistor 11 by the amount of threshold voltage (absolute value) of the PMOS transistor 21, the PMOS transistor 13 can charge the load connected to the output terminal N2 with high current drive capability. Accordingly, even when an element size of the PMOS transistor 13 is decreased, the PMOS transistor 13 allows properly charging the load connected to the output terminal N2, and therefore an area occupied by a chip in the amplifier circuit 100 can be reduced.

In a case where the first differential signal VN3 in the differential stage 10 substantially decreases, the first shift signal VN5 also decreases following this. However, the electric potential variation of the first shift signal VN5 is restricted within a voltage range up to the withstand voltage (Vgs maximum applied voltage) of the PMOS transistor 13 by the PMOS transistor 22. In view of this, own gate-source voltage of the PMOS transistor 13 is restricted within the withstand voltage, and element breakdown due to an excess of the withstand voltage is avoided.

When the electric potential of the load connected to the output terminal N2 approaches the output signal VO according to the input signal VI, the first and second differential signals VN3 and VN4 in the first and second output ends N3 and N4 of the differential stage 10 gradually increase from the lowered electric potentials and become the stable state when returning to the electric potentials in the initial state. Similarly, the first shift signal VN5 also increases following the first differential signal VN3 and becomes the stable state when returning to the electric potential in the initial state. The PMOS transistor 13 is stabilized in the OFF state.

Next, an operation when the input signal VI changes to a voltage on the power supply potential E2 side (low electric potential side) in a data period subsequent to the data period during which the input signal VI and the output signal VO are both in the stable state will be described. The first and second differential signals VN3 and VN4 in the first and second output ends N3 and N4 of the differential stage 10 both change to the power supply potential E1 side (high electric potential side) and the PMOS transistor 11 enters the OFF state. In contrast to this, the NMOS transistor 12 increases own gate-source voltage difference and enters the ON state and discharges the load connected to the output terminal N2, that is, an electric charge accumulated to the load capacitance of the data line.

The increase in the first differential signal VN3 in the differential stage 10 increases the first shift signal VN5 output from the first potential control circuit 20 up to the power supply potential E1. Thus, the PMOS transistor 13 enters the OFF state. The increase in the second differential signal VN4 in the differential stage 10 also increases the second shift signal VN6 output from the second potential control circuit 30 from the proximity of the power supply potential E2. When the gate-source voltage difference of the NMOS transistor 14 increases by the second shift signal VN6 and exceeds the threshold voltage of the NMOS transistor 14, the NMOS transistor 14 turns ON.

Accordingly, the NMOS transistor 14 discharges the load connected to the output terminal N2, that is, the electric charge accumulated to the load capacitance of the data line. That is, in cooperation with the above-described discharge operation by the NMOS transistor 12, the discharge speed is promoted.

As described above, the NMOS transistor 14 has the drain current vs. gate-source voltage characteristics indicated by the characteristic curve L2 of FIG. 4. Accordingly, the NMOS transistor 14 has current drive capability higher than that of the NMOS transistor 12, which has the drain current vs. gate-source voltage characteristics indicated by the characteristic curve L1 of FIG. 4. Therefore, even when the gate-source voltage difference of the NMOS transistor 14 is smaller than the gate-source voltage difference of the NMOS transistor 12 by the amount of threshold voltage of the NMOS transistor 31, the NMOS transistor 14 can charge the load connected to the output terminal N2 with high current drive capability. Accordingly, even when an element size of the NMOS transistor 14 is decreased, the NMOS transistor 14 allows properly discharging the electric charge accumulated to the load connected to the output terminal N2, and therefore the area occupied by the chip in the amplifier circuit 100 can be reduced.

In a case where the second differential signal VN4 in the differential stage 10 substantially increases, the second shift signal VN6 also increases following this. However, the electric potential variation of the second shift signal VN6 is restricted within a voltage range up to the withstand voltage (Vgs maximum applied voltage) of the NMOS transistor 14 by the NMOS transistor 32. In view of this, the gate-source voltage of the NMOS transistor 14 is restricted within the withstand voltage, and element breakdown due to an excess of the withstand voltage is avoided.

When the electric potential of the load connected to the output terminal N2 approaches the output signal VO according to the input signal VI, the first and second differential signals VN3 and VN4 in the first and second output ends N3 and N4 of the differential stage 10 gradually decrease from the increased electric potentials and become the stable state when returning to the electric potentials in the initial state. Similarly, the second shift signal VN6 also decreases corresponding to the second differential signal VN4 and becomes the stable state when returning to the electric potential in the initial state. The NMOS transistor 14 is stabilized in the OFF state.

Thus, the amplifier circuit 100 illustrated in FIG. 3 employs the element having the large drain current relative to the gate-source voltage compared with that of the usual MOS transistor, for example, like the LDMOS transistor, as the output transistors 13 and 14 in the boost circuit BST. The LDMOS transistor uses the element formed so as to have a withstand voltage against a drain-source voltage |Vds| equal to or more than that of the usual MOS transistor and have a withstand voltage against the gate-source voltage |Vgs| lower than the withstand voltage of the drain-source voltage |Vds|.

That is, the amplifier circuit 100 employs a transistor, for example, like the LDMOS transistor, having the large drain current relative to the gate-source voltage and the low withstand voltage against the gate-source voltage compared with those of the output transistors 11 and 12, which are included in the differential amplifier, as the output transistors 13 and 14 included in the boost circuit BST. Therefore, the amplifier circuit 100 includes the transistors 22 and 32 that restrict the variation ranges of the gate potentials of both transistors (13, 14) so as not to exceed the withstand voltages against the gate-source voltages of the output transistors 13 and 14. However, as long as a design where the first differential signal VN3 in the differential stage 10 always becomes equal to or more than the bias signal VBP and the second differential signal VN4 in the differential stage 10 always becomes equal to or less than the bias signal VBN is made, the transistors 22 and 32 may be omitted.

In short, the amplifier circuit 100 including the input terminal (N1) receiving the input signal (VI) and the output terminal (N2) outputting the amplified output signal (VO) only needs to include the following first and second power supply terminals, differential stage, first and second potential control circuits, and first to fourth output transistors.

That is, the first and second power supply terminals (NE1, NE2) receive the first power supply potential (E1) and the second power supply potential (E2) lower than the first power supply potential, respectively.

The differential stage (10) generates the first differential signal (VN3) corresponding to the difference between the input signal and the output signal and the second differential signal (VN4) generated as a signal which is the same phase with a different potential of the first differential signal.

The first output transistor (11) is a first conductivity type (P channel type), connected to the first power supply terminal (NE1), receives the first differential signal (VN3) by own control terminal (gate), and supplies the current corresponding to the first differential signal based on the first power supply potential to the output terminal (N2).

The second output transistor (12) is a second conductivity type (N channel type), connected to the second power supply terminal (NE2), receives the second differential signal (VN4) by own control terminal (gate), and flows the current corresponding to the second differential signal from the output terminal (N2) to the second power supply terminal (NE2).

The first potential control circuit (20) level-shifts the first differential signal (VN3) to the first power supply potential (E1) side to generate the first shift signal (VN5).

The second potential control circuit (30) level-shifts the second differential signal (VN4) to the second power supply potential (E2) side to generate the second shift signal (VN6).

The third output transistor (13) is a first conductivity type (P channel type), connected to the first power supply terminal (NE1), receives the first shift signal (VN5) by own control terminal (gate), and supplies the current corresponding to the first shift signal based on the first power supply potential to the output terminal (N2).

The fourth output transistor (14) is a second conductivity type (N channel type), connected to the second power supply terminal (NE2), receives the second shift signal (VN6) by own control terminal (gate), and flows the current corresponding to the second shift signal from the output terminal (N2) to the second power supply terminal.

The third output transistor (13) is a transistor having the withstand voltage against the voltage (Vgs) between the first power supply terminal and the control terminal lower than that of the first output transistor (11) and the drain current corresponding to the voltage (Vgs) between the first power supply terminal and the control terminal larger than that of the first output transistor (11). The fourth output transistor (14) is a transistor having the withstand voltage against the voltage (Vgs) between the second power supply terminal and the control terminal lower than that of the second output transistor (12) and the drain current corresponding to the voltage (Vgs) between the second power supply terminal and the control terminal larger than that of the second output transistor (12).

Accordingly, the amplifier circuit 100 illustrated in FIG. 3 allows promoting the charging and discharge speeds to the load (for example, the load capacitance of the data line) without increase in element size of the output transistor 13 or 14. Therefore, the present invention allows shortening the output response time of the amplifier circuit without increase in area occupied by the chip or cost increase.

While the configuration of the boost circuit BST that includes both of the first and second potential control circuits 20 and 30 and the third and fourth output transistors 13 and 14 in the amplifier circuit 100 has been described in the first embodiment, the configuration may include only one of the first potential control circuit 20 and the third output transistor 13 or the second potential control circuit 30 and the third output transistor 14. Such a configuration is preferred as the amplifier circuit 100 in which one of the charging speed or the discharge speed to the output terminal N2 is set to be especially high.

Second Embodiment

Figure 5:
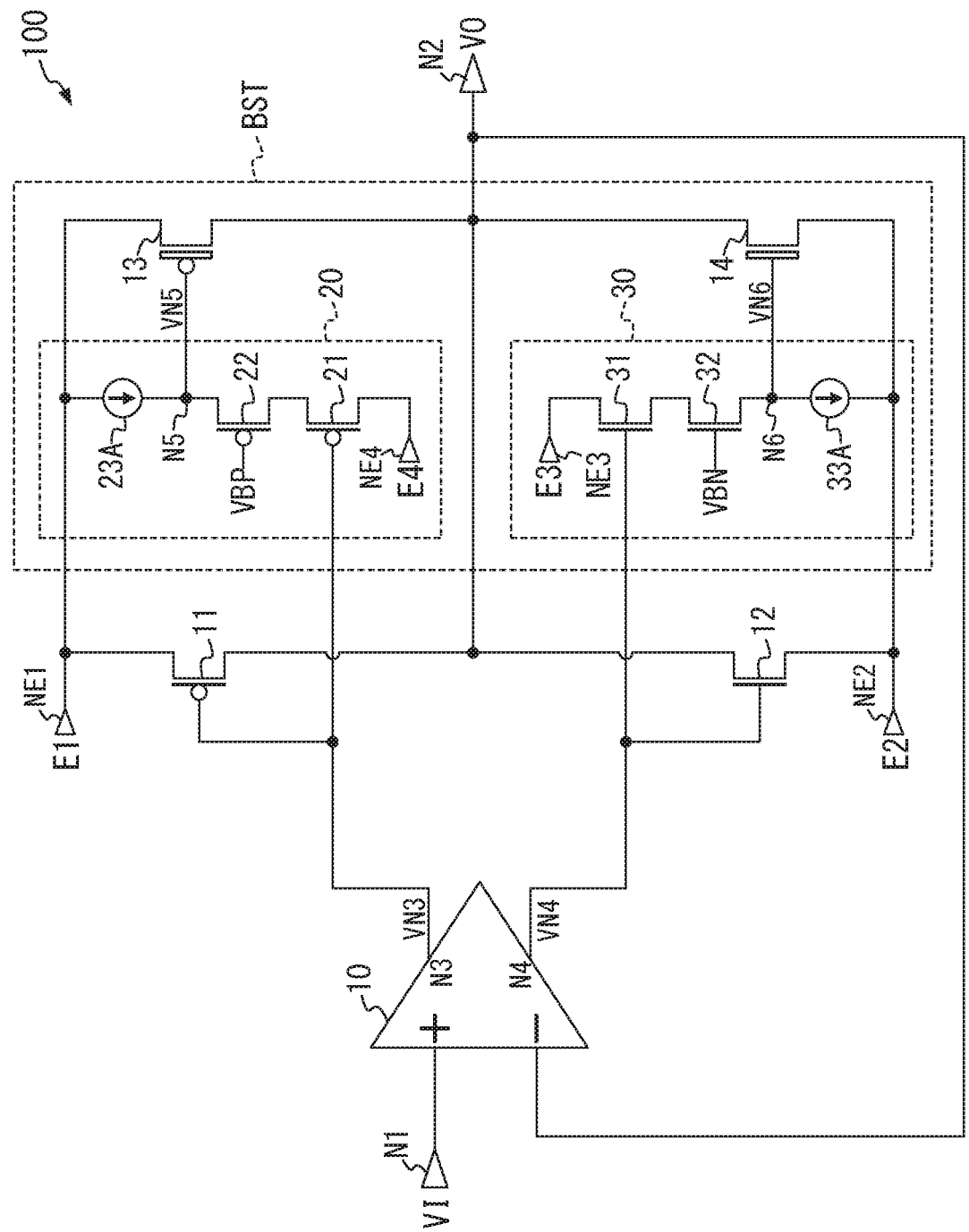
FIG. 5 is a circuit diagram illustrating a second embodiment of the amplifier circuit 100.

FIG. 5 is a circuit diagram illustrating an internal configuration of the amplifier circuit 100 as the second embodiment of the present invention that employs current sources 23A and 33A as the first load element 23 and the second load element 33 included in the first and second potential control circuits 20 and 30, respectively, illustrated in FIG. 3. In the configuration illustrated in FIG. 5, other configurations excluding the current sources 23A and 33A employed as the first load element 23 and the second load element 33 illustrated in FIG. 3 are same as ones illustrated in FIG. 3.

In FIG. 5, the current source 23A is connected between the node N5 and the power supply terminal NE1, generates a predetermined constant current based on the power supply potential E1 received by the power supply terminal NE1, and delivers it to the node N5. As illustrated in FIG. 5, the current source 33A is connected between the node N6 and the power supply terminal NE2 and extracts a predetermined constant current from the node N6.

Current values of constant currents flown by the current sources 23A and 33A are each set to current values not interfering with variation in the first or second shift signal VN5 or VN6. Specifically, the current source 23A may be configured of a PMOS transistor that receives a predetermined bias voltage by own gate. Similarly, the current source 33A may be configured of a NMOS transistor that receives a predetermined bias voltage by own gate. The current sources 23A and 33A stably maintain the output transistors 13 and 14 in the OFF state in the stable output state, respectively.

Third Embodiment

Figure 6:
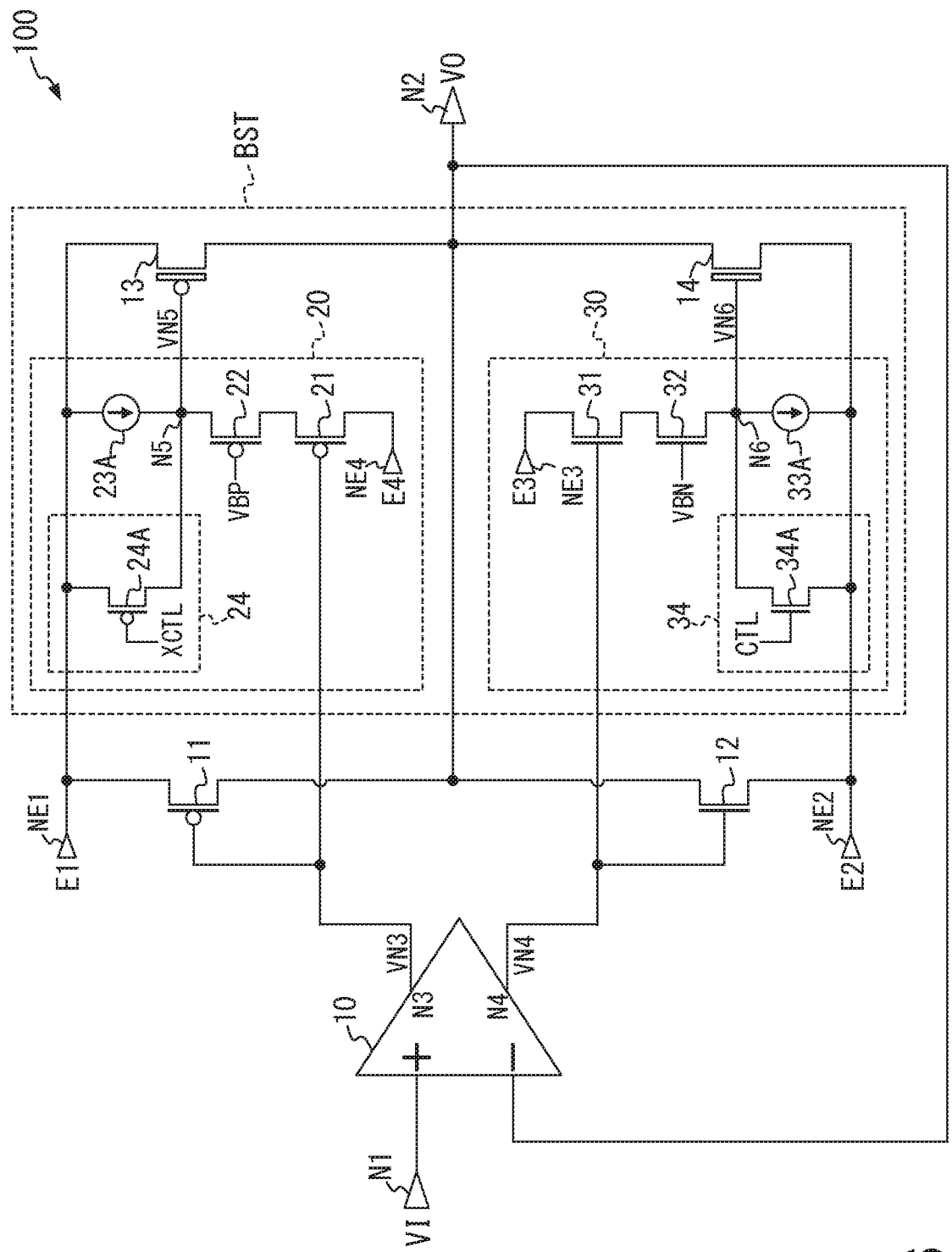
FIG. 6 is a circuit diagram illustrating a third embodiment of the amplifier circuit 100.

FIG. 6 is a circuit diagram illustrating an internal configuration of the amplifier circuit 100 as the third embodiment of the present invention that employs other internal configurations as the first and second potential control circuits 20 and 30 illustrated in FIG. 5. In the configuration illustrated in FIG. 6, excluding that withstand voltage protection circuits 24 and 34 are newly disposed in the first and second potential control circuits 20 and 30, respectively, in the boost circuit BST, the other configurations are same as ones illustrated in FIG. 5.

For example, the withstand voltage protection circuit 24 includes a first conductivity type (P channel type) transistor 24A having own first terminal (source) connected to the power supply terminal NE1 and second terminal (drain) connected to the control terminal (gate) of the output transistor 13 via the node N5. The transistor 24A receives a control signal XCTL by own control terminal (gate).

For example, the withstand voltage protection circuit 34 includes a second conductivity type (N channel type) transistor 34A having own first terminal (source) connected to the power supply terminal NE2 and second terminal (drain) connected to the control terminal (gate) of the output transistor 14 via the node N6. The transistor 34A receives a control signal CTL by own control terminal (gate).

The control signals CTL and XCTL are signals whose phases are inverted to one another and generated in, for example, the drive controller 101. In this case, the drive controller 101 supplies the control signal XCTL at a logic level 0 and the control signal CTL at a logic level 1 to perform withstand voltage protection to the withstand voltage protection circuits 24 and 34 for a predetermined period, for example, from a time point of activation of a power supply until a time point of completion of the activation of the power supply at which the power supply potential reaches a regulated voltage value. After the completion of activation of the power supply, the drive controller 101 supplies the control signal XCTL at the logic level 1 and the control signal CTL at the logic level 0 to stop the withstand voltage protection to the withstand voltage protection circuits 24 and 34.

Accordingly, the transistors 24A and 34A enter the ON state only in a case where the first and second shift signals VN5 and VN6 become an unsettled state until a bias circuit to supply the bias voltages VBN and VBP stably operates, for example, during the activation of the power supply, and the gate-source voltage differences of the output transistors 13 and 14 possibly become in excess of the withstand voltages. Accordingly, the gate-source voltage differences of the output transistors 13 and 14 are promptly zeroed from the unsettled state of the first and second shift signals VN5 and VN6 immediately after the activation of the power supply.

Accordingly, the withstand voltage protection circuits 24 and 34 avoid the gate-source voltage differences of the output transistors 13 and 14 in excess of the withstand voltages during the unstable operation (for example, during the activation of the power supply) of the amplifier circuit 100.

While the above-described embodiment has described that the drive controller 101 generates the control signals CTL and XCTL, a circuit to generate these control signals CTL and XCTL may be disposed in the data driver 103.

Fourth Embodiment

Figure 7:
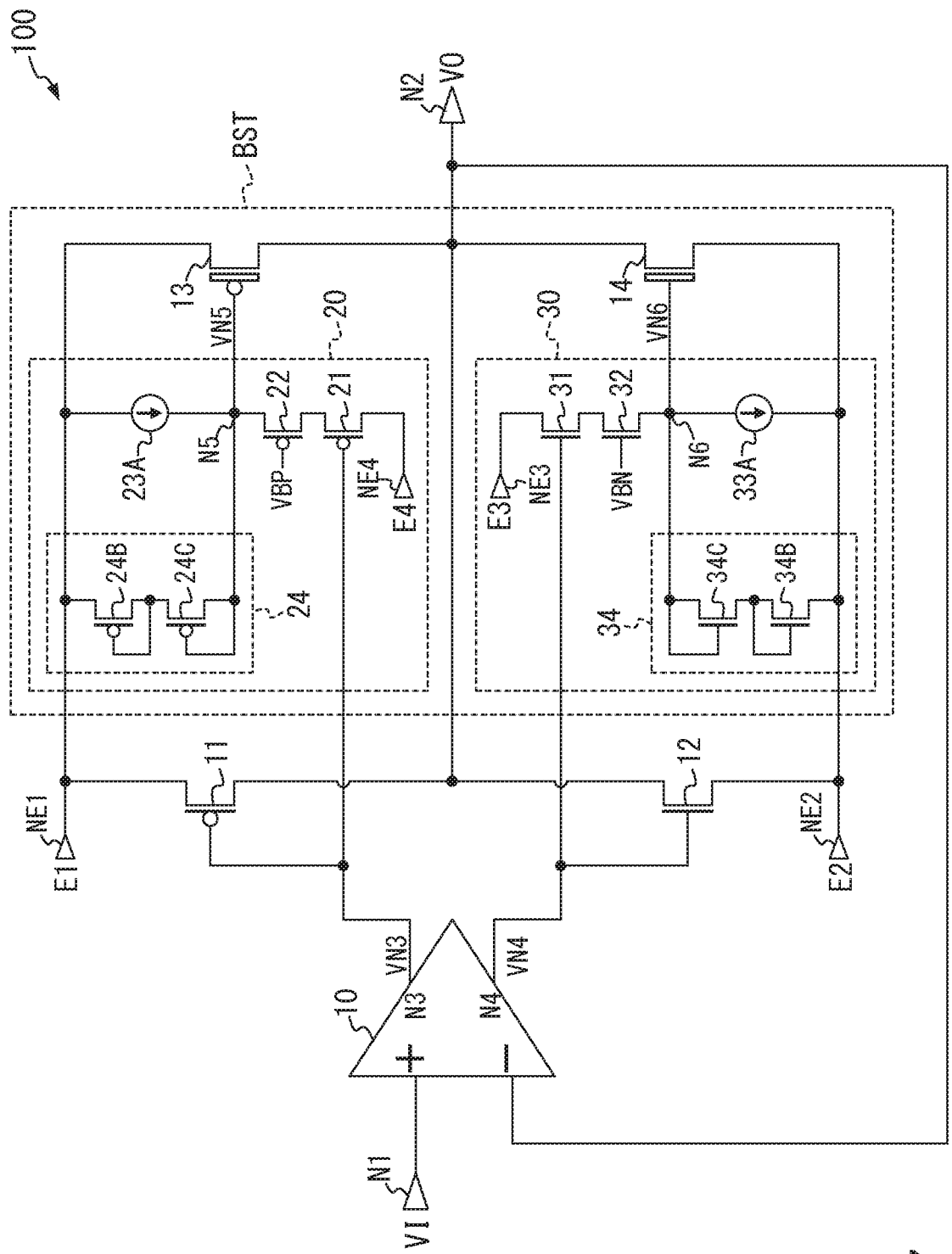
FIG. 7 is a circuit diagram illustrating a fourth embodiment of the amplifier circuit 100.

FIG. 7 is a circuit diagram illustrating an internal configuration of the amplifier circuit 100 as the fourth embodiment of the present invention that employs other internal configurations as the withstand voltage protection circuits 24 and 34 illustrated in FIG. 6. Note that the other configurations excluding the internal configurations of the respective withstand voltage protection circuits 24 and 34 are same as ones illustrated in FIG. 6.

In the configuration illustrated in FIG. 7, the withstand voltage protection circuit 24 includes first conductivity type (P channel type) transistors 24B and 24C. The transistor 24B has own first terminal (source) connected to the power supply terminal NE1 and second terminal (drain) and control terminal (gate) both connected to a first terminal (source) of the transistor 24C. The transistor 24C has own second terminal (drain) and control terminal (gate) both connected to the control terminal (gate) of the output transistor 13 via the node N5. The transistors 24B and 24C are constructed with element sizes such that a sum of respective threshold voltages (absolute values) becomes a voltage slightly lower than the withstand voltage (Vgs maximum applied voltage) of the output transistor 13.

Thus, the withstand voltage protection circuit 24 has the configuration in which the respective diode-connected first conductivity type (P channel type) transistors 24B and 24C are cascade-connected between the node N5 and the power supply terminal NE1.

The withstand voltage protection circuit 34 includes second conductivity type (N channel type) transistors 34B and 34C. The transistor 34B has own first terminal (source) connected to the power supply terminal NE2, and second terminal (drain) and control terminal (gate) both connected to a first terminal (source) of the transistor 34C. The transistor 34C has own second terminal (drain) and control terminal (gate) both connected to the control terminal (gate) of the output transistor 14 via the node N6. The transistors 34B and 34C are constructed with element sizes such that a sum of respective threshold voltages (absolute values) become a voltage slightly lower than the withstand voltage (Vgs maximum applied voltage) of the output transistor 14.

Thus, the withstand voltage protection circuit 34 has the configuration in which the respective diode-connected first conductivity type (P channel type) transistors 34B and 34C are cascade-connected between the node N6 and the power supply terminal NE2.

With the configuration, when the first and second shift signals VN5 and VN6 exceed the respectively configured sums of the threshold voltages, the transistors 24B, 24C, 34B, and 34C enter the ON state and the electric potential variations of the first and second shift signals VN5 and VN6 are restricted. Accordingly, including the case where the first and second shift signals VN5 and VN6 possibly enter the unsettled state, for example, during the activation of the power supply, the gate-source voltage differences of the output transistors 13 and 14 in excess of the withstand voltages can be avoided. The number of stages that the respective diode-connected transistors are cascade-connected inside the respective withstand voltage protection circuits 24 and 34 is not limited to two stages as illustrated in FIG. 7, but may be a plural of three or more.

Fifth Embodiment

Figure 8:
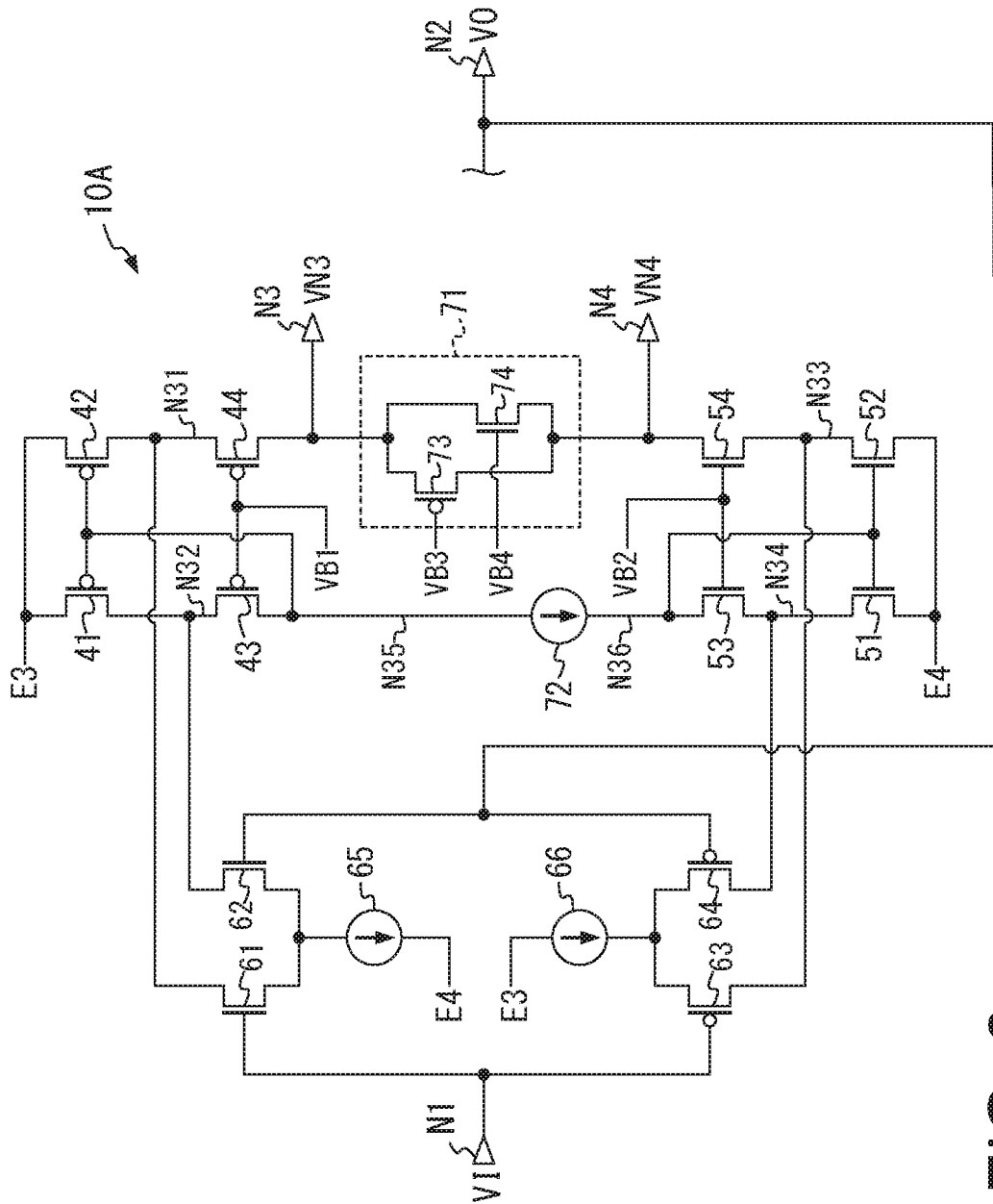
FIG. 8 is a circuit diagram of a differential stage 10A.

FIG. 8 is a circuit diagram illustrating a differential stage 10A as one example of the differential stage 10 in the amplifier circuit 100 of FIG. 1.

The differential stage 10A includes an NMOS differential pair including second conductivity type (N channel type) transistors 61 and 62, a PMOS differential pair including first conductivity type (P channel type) transistors 63 and 64, and current sources 65 and 66.

The current source 65 has own one end connected to the power supply terminal E4 on a low electric potential side, and other end connected to respective first terminals (sources) of the transistors 61 and 62 in common. The current source 66 has own one end connected to the power supply terminal E3 on a high electric potential side, and other end connected to respective first terminals (sources) of the transistors 63 and 64 in common.

A control terminal (gate) of each of the transistors 61 and 63, that is, one input of each of the NMOS differential pair and the PMOS differential pair is connected to the input terminal N1 as non-inverting input ends (+) of the differential stage 10A. A control terminal (gate) of each of the transistors 62 and 64, that is, the other input of each of the NMOS differential pair and the PMOS differential pair is connected to the output terminal N2 as inverting input ends (−) of the differential stage 10A.

The differential stage 10A includes first conductivity type (P channel type) transistors 41 to 44 connected to the NMOS differential pair (61, 62).

The transistors 41 and 42 have first terminals (sources) each connected to the power supply terminal E3 on the high electric potential side and control terminals (gates) mutually connected in common. The transistor 41 has a second terminal (drain) connected to a first terminal (source) of the transistor 43 and a second terminal (drain) of the transistor 62 included in the NMOS differential pair via a node N32. The transistor 42 has a second terminal (drain) connected to a first terminal (source) of the transistor 44 and a second terminal (drain) of the transistor 61 included in the above-described NMOS differential pair via a node N31.

The transistors 43 and 44 receive a bias voltage VB1 by respective control terminals (gates). The transistor 43 has the second terminal (drain) connected to the control terminals (gates) of the respective transistors 41 and 42 and a node N35. The transistor 44 has a second terminal (drain) connected to the first output terminal N3.

The transistors 41 to 44 constitute a first cascode current mirror circuit. The drains of the transistors 44 and 43 serve as a first terminal and a second terminal of the first cascode current mirror circuit, respectively.

The differential stage 10A includes second conductivity type (N channel type) transistors 51 to 54 connected to the above-described PMOS differential pair (63, 64).

The transistors 51 and 52 have first terminals (sources) each connected to the power supply terminal E4 on the low electric potential side, and control terminals (gates) mutually connected in common. The transistor 51 has a second terminal (drain) connected to a first terminal (source) of the transistor 53 and a second terminal (drain) of the transistor 64 included in the PMOS differential pair via a node N34. The transistor 52 has a second terminal (drain) connected to a first terminal (source) of the transistor 54 and a second terminal (drain) of the transistor 63 included in the above-described PMOS differential pair via a node N33.

The transistors 53 and 54 receive a bias voltage VB2 by respective control terminals (gates). The transistor 53 has a second terminal (drain) connected to respective control terminals (gates) of the transistors 51 and 52 and a node N36. The transistor 54 has a second terminal (drain) connected to the second output terminal N4.

The transistors 51 to 54 constitute a second cascode current mirror circuit. Here, the drains of the transistors 54 and 53 serve as a first terminal and a second terminal of the second cascode current mirror circuit, respectively.

The respective first terminals of the first and second cascode current mirror circuits serve as the first output terminal N3 and the second output terminal N4 of the differential stage 10A.

Further, the differential stage 10A includes a first floating current source 71 and a second floating current source 72.

The floating current source 71 is connected between the first terminal (N3) in the first cascode current mirror circuit and the first terminal (N4) in the second cascode current mirror circuit. The floating current source 72 is connected between a second terminal (N35) in the first cascode current mirror circuit and a second terminal (N36) in the second cascode current mirror circuit.

The floating current source 71 includes a first conductivity type (P channel type) transistor 73 and a second conductivity type (N channel type) transistor 74. The transistor 73 has own first terminal (source) connected to the second terminal (drain) of the transistor 44 in the first cascode current mirror circuit and second terminal (drain) connected to the second terminal (drain) of the transistor 54 in the second cascode current mirror circuit. The transistor 74 has own first terminal (source) connected to the second terminal (drain) of the transistor 54 in the second cascode current mirror circuit and second terminal (drain) connected to the second terminal (drain) of the transistor 44 in the first cascode current mirror circuit. The transistor 73 receives a bias voltage VB3 by own control terminal (gate), and the transistor 74 receives a bias voltage VB4 by own control terminal (gate).

The floating current source 71 flows constant currents according to the bias voltages VB3 and VB4 between the first terminals, which are the first terminal (N3) in the first cascode current mirror circuit and the first terminal (N4) in the second cascode current mirror circuit.

The floating current source 72 has own one end connected to the node N35 and other end connected to the node N36. The floating current source 72 flows a predetermined constant current between the second terminals, which are the second terminal (N35) in the first cascode current mirror circuit and the second terminal (N36) in the second cascode current mirror circuit.

With the configuration, in the differential stage 10A, when the input signal VI in the input terminal N1 changes relative to the output signal VO in the output terminal N2, the electric potentials of the output terminal pair (N3, N4) each act opposite to the voltage change of the input signal VI.

For example, a capacitor for phase compensation may be disposed between the output terminal N2 of the amplifier circuit 100 of FIG. 3 and at least one terminal among the respective terminals in the differential stage 10A to achieve output stabilization of the amplification operation.

As described above, the boost circuit BST included in the amplifier circuit 100 illustrated in FIG. 3 and FIG. 5 to FIG. 7 allows promptly following the change in the input signal VI and charging and discharging the load connected to the output terminal N2 with sufficient current drive capability. Even when the sizes of the output transistors 13 and 14 are decreased, the boost circuit BST allows properly shortening the output response time of the amplifier circuit 100.

Accordingly, employing the output unit 806 including the n amplifier circuits 100 as illustrated in FIG. 2 allows area saving and low cost of the data driver 103 itself.

Further, since the amplifier circuit 100 allows shortening the output response time, including the amplifier circuits 100 in the data driver 103 allows achieving high-quality display adapting to increased screen size and higher resolution of a display panel at low cost.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2019-62959 filed on Mar. 28, 2019, the entire contents of which are incorporated herein by reference.

What is claimed is:

1. A semiconductor device comprising:
    an input terminal configured to receive an input signal;
    an output terminal configured to output an output signal;
    first and second power supply terminals configured to receive a first power supply potential and a second power supply potential which is lower than the first power supply potential, respectively;
    a differential stage configured to generate a first differential signal and a second differential signal, the first differential signal corresponding to a difference between the input signal and the output signal, the second differential signal being generated as a signal which is a same phase with a different potential of the first differential signal;
    a first conductivity type first output transistor connected to the first power supply terminal, the first output transistor being configured to receive the first differential signal by an own control terminal, the first output transistor being configured to supply a current corresponding to the first differential signal based on the first power supply potential to the output terminal;
    a second conductivity type second output transistor connected to the second power supply terminal, the second output transistor being configured to receive the second differential signal by an own control terminal, the second output transistor being configured to flow a current corresponding to the second differential signal from the output terminal to the second power supply terminal;
    a first potential control circuit configured to level-shift a signal level of the first differential signal to a first power supply potential side to generate a first shift signal;
    a second potential control circuit configured to level-shift a signal level of the second differential signal to a second power supply potential side to generate a second shift signal;
    a first conductivity type third output transistor connected to the first power supply terminal, the third output transistor being configured to receive the first shift signal by an own control terminal, the third output transistor being configured to supply a current corresponding to the first shift signal based on the first power supply potential to the output terminal; and
    a second conductivity type fourth output transistor connected to the second power supply terminal, the fourth output transistor being configured to receive the second shift signal by an own control terminal, the fourth output transistor being configured to flow a current corresponding to the second shift signal from the output terminal to the second power supply terminal, wherein
    the third output transistor is a transistor having a withstand voltage against a voltage between the first power supply terminal and the control terminal lower than a withstand voltage of the first output transistor and a drain current corresponding to the voltage between the first power supply terminal and the control terminal larger than a drain current of the first output transistor, and
    the fourth output transistor is a transistor having a withstand voltage against a voltage between the second power supply terminal and the control terminal lower than a withstand voltage of the second output transistor and a drain current corresponding to the voltage between the second power supply terminal and the control terminal larger than a drain current of the second output transistor.

2. The semiconductor device according to claim 1, further comprising:
    a third power supply terminal configured to receive a third power supply potential having a magnitude equal to or more than an electric potential of the first power supply potential; and
    a fourth power supply terminal configured to receive a fourth power supply potential having a magnitude equal to or less than an electric potential of the second power supply potential, wherein the first potential control circuit includes a first load element and first conductivity type first and second transistors, the first load element has an own first terminal connected to the first power supply terminal and a second terminal connected to the control terminal of the third output transistor, the first and second transistors are cascade-connected between the second terminal of the first load element and the fourth power supply terminal, and the first potential control circuit is configured to receive the first differential signal by the control terminal of the first transistor and receive a first bias signal by the control terminal of the second transistor to output the first shift signal from the second terminal of the first load element, and the second potential control circuit includes a second load element and second conductivity type third and fourth transistors, the second load element has an own first terminal connected to the second power supply terminal and a second terminal connected to the control terminal of the fourth output transistor, the third and fourth transistors are cascade-connected between the second terminal of the second load element and the third power supply terminal, and the second potential control circuit is configured to receive the second differential signal by the control terminal of the third transistor and receive a second bias signal by the control terminal of the fourth transistor to output the second shift signal from the second terminal of the second load element.

3. The semiconductor device according to claim 2, wherein
the first load element includes a current source or a resistive element, and the second load element includes a current source or a resistive element.

4. The semiconductor device according to claim 3, wherein
the first potential control circuit includes a first switch, and the first switch is configured such that when an ON state is set, the first switch connects the second terminal of the first load element to the first power supply terminal,
the second potential control circuit includes a second switch, and the second switch is configured such that when an ON state is set, the second switch connects the second terminal of the second load element to the second power supply terminal, and
the first and second switches are both set to the ON state only for a predetermined period from a time point of turning on a power supply.

5. The semiconductor device according to claim 3, wherein
the first potential control circuit includes a plurality of diode-connected transistors cascade-connected between the second terminal of the first load element and the first power supply terminal, and
the second potential control circuit includes a plurality of diode-connected transistors cascade-connected between the second terminal of the second load element and the second power supply terminal.

6. The semiconductor device according to claim 1, wherein
the differential stage includes:
a first current source and a second current source;
a second conductivity type first differential pair configured to receive a first input and a second input as an input pair, the first differential pair being configured to draw currents generated by dividing a current generated in the first current source into two based on the first input and the second input from an own output pair;
a first conductivity type second differential pair configured to receive the first input and the second input, the second differential pair being configured to deliver currents generated by dividing a current generated in the second current source into two based on the first input and the second input from an own output pair;
a first conductivity type first cascode current mirror circuit connected to the output pair of the first differential pair, the first cascode current mirror circuit being configured to deliver currents corresponding to the currents drawn into the output pair of the first differential pair by an own first end, the first cascode current mirror circuit being configured to deliver currents corresponding to the currents delivered to the first end to an own second end;
a first floating current source having one end connected to the first end of the first cascode current mirror circuit;
a second floating current source having one end connected to the second end of the first cascode current mirror circuit; and
a second conductivity type second cascode current mirror circuit connected to the output pair of the second differential pair, the second cascode current mirror circuit being configured to draw currents corresponding to the currents delivered from the output pair of the second differential pair from an own first end, the second cascode current mirror circuit being configured to draw currents corresponding to the currents drawn to the first end from an own second end, wherein
the input terminal is configured to receive the first input and receive the output signal output from the output terminal as the second input,
the first floating current source has another end connected to the first end of the second cascode current mirror circuit, and the second floating current source has another end connected to the second end of the second cascode current mirror circuit, and
the first differential signal is output from the second end of the first cascode current mirror circuit, and the second differential signal is output from the second end of the second cascode current mirror circuit.

7. The semiconductor device according to claim 1, wherein
the first and second output transistors are both MOS transistors, and
the third and fourth output transistors include insulating films between gate electrodes serving as the control terminals and semiconductor layers thinner than an insulating film of the first output transistor or are Laterally Diffused MOS (LDMOS) type transistors.

8. A semiconductor device comprising:
an input terminal configured to receive an input signal;
an output terminal configured to output an output signal;
first and second power supply terminals configured to receive a first power supply potential and a second power supply potential different from the first power supply potential, respectively;
a differential stage configured to generate a first differential signal and a second differential signal, the first differential signal corresponding to a difference between the input signal and the output signal, the second differential signal being generated as a signal which is a same phase with a different potential of the first differential signal;

a first conductivity type first output transistor connected to the first power supply terminal, the first output transistor being configured to receive the first differential signal by an own control terminal, the first output transistor being configured to output a current corresponding to the first differential signal based on the first power supply potential to the output terminal;

a second conductivity type second output transistor connected to the second power supply terminal, the second output transistor being configured to receive the second differential signal by an own control terminal, the second output transistor being configured to output a current corresponding to the second differential signal based on the second power supply potential to the output terminal;

a first potential control circuit configured to level-shift a signal level of the first differential signal to a first power supply potential side to generate a first shift signal; and a first conductivity type third output transistor connected to the first power supply terminal, the third output transistor being configured to receive the first shift signal by an own control terminal, the third output transistor being configured to output a current corresponding to the first shift signal based on the first power supply potential to the output terminal, wherein the third output transistor is a transistor having a withstand voltage against a voltage between the first power supply terminal and the control terminal lower than a withstand voltage of the first output transistor and a drain current corresponding to the voltage between the first power supply terminal and the control terminal larger than a drain current of the first output transistor.

9. The semiconductor device according to claim 8, further comprising a third power supply terminal configured to receive a third power supply potential, the third power supply potential having a direction with respect to the first power supply potential same as the second power supply potential and an electric potential difference equal to or more than the second power supply potential, wherein the first potential control circuit includes a first load element and first conductivity type first and second transistors, the first load element has an own first terminal connected to the first power supply terminal and a second terminal connected to the control terminal of the third output transistor, the first and second transistors are cascade-connected between the second terminal of the first load element and the third power supply terminal, and the first potential control circuit is configured to receive the first differential signal by the control terminal of the first transistor and receive a first bias signal by the control terminal of the second transistor to output the first shift signal from the second terminal of the first load element.

10. The semiconductor device according to claim 9, wherein the first load element includes a current source or a resistive element.

11. The semiconductor device according to claim 10, wherein the first potential control circuit includes a first switch, and the first switch is configured such that when an ON state is set, the first switch connects the second terminal of the first load element to the first power supply terminal, and the first switch is set to the ON state only for a predetermined period from a time point of turning on a power supply.

12. The semiconductor device according to claim 10, wherein the first potential control circuit includes a plurality of diode-connected transistors cascade-connected between the second terminal of the first load element and the first power supply terminal.

13. The semiconductor device according to claim 8, wherein the first and second output transistors are both MOS transistors, and the third output transistor includes an insulating film between a gate electrode serving as the control terminal and a semiconductor layer thinner than an insulating film of the first output transistor or is a Laterally Diffused MOS (LDMOS) type transistor.

14. A data driver comprising:

a plurality of amplifier circuits configured to individually amplify a plurality of gradation voltages having respective voltage values corresponding to luminance levels of a plurality of respective pixels, the plurality of amplifier circuits being configured to supply the amplified gradation voltages to a display device, wherein the amplifier circuits each include:

an input terminal configured to receive the gradation voltage as an input signal;

an output terminal configured to supply an output signal obtained by amplifying the gradation voltage to the display device;

first and second power supply terminals configured to receive a first power supply potential and a second power supply potential different from the first power supply potential, respectively;

a differential stage configured to generate a first differential signal and a second differential signal, the first differential signal corresponding to a difference between the input signal and the output signal, the second differential signal being generated as a signal which is a same phase with a different potential of the first differential signal;

a first conductivity type first output transistor connected to the first power supply terminal, the first output transistor being configured to receive the first differential signal by an own control terminal, the first output transistor being configured to output a current corresponding to the first differential signal based on the first power supply potential to the output terminal;

a second conductivity type second output transistor connected to the second power supply terminal, the second output transistor being configured to receive the second differential signal by an own control terminal, the second output transistor being configured to output a current corresponding to the second differential signal based on the second power supply potential to the output terminal;

a first potential control circuit configured to level-shift a signal level of the first differential signal to a first power supply potential side to generate a first shift signal; and a first conductivity type third output transistor connected to the first power supply terminal, the third output transistor being configured to receive the first shift signal by an own control terminal, the third output transistor being configured to output a current corresponding to the first shift signal based on the first power supply potential to the output terminal, wherein the third output transistor is a transistor having a withstand voltage against a voltage between the first power supply terminal and the control terminal lower than a withstand voltage of the first output transistor and a drain current corresponding to the voltage between the first power supply terminal and the control terminal larger than a drain current of the first output transistor.

15. The data driver according to claim 14, further comprising:

a second potential control circuit configured to level-shift a signal level of the second differential signal to a second power supply potential side to generate a second shift signal; and a second conductivity type fourth output transistor connected to the second power supply terminal, the fourth output transistor being configured to receive the second shift signal by an own control terminal, the fourth output transistor being configured to output a current corresponding to the second shift signal based on the second power supply potential to the output terminal, wherein the fourth output transistor is a transistor having a withstand voltage against a voltage between the second power supply terminal and the control terminal lower than a withstand voltage of the second output transistor and a drain current corresponding to the voltage between the second power supply terminal and the control terminal larger than a drain current of the second output transistor.

* * * * *